(12) United States Patent
Perner

(10) Patent No.: US 8,542,515 B2
(45) Date of Patent: Sep. 24, 2013

(54) CONNECTION AND ADDRESSING OF MULTI-PLANE CROSSPOINT DEVICES

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/384,872

(22) PCT Filed: Apr. 30, 2010

(86) PCT No.: PCT/US2010/033141
§ 371 (c)(1),
(2), (4) Date: Jan. 19, 2012

(87) PCT Pub. No.: WO2011/136795
PCT Pub. Date: Nov. 3, 2011

(65) Prior Publication Data
US 2013/0039111 A1  Feb. 14, 2013

(51) Int. Cl.
*G11C 5/06* (2006.01)
(52) U.S. Cl.
USPC .................................. 365/63; 365/69; 365/72
(58) Field of Classification Search
USPC ....................................................... 365/130
See application file for complete search history.

(56) References Cited

U.S. PATENT DOCUMENTS

| 6,185,122 | B1* | 2/2001 | Johnson et al. ................ 365/103 |
| 7,339,811 | B2* | 3/2008 | Nejad et al. ...................... 365/63 |
| 8,369,125 | B2* | 2/2013 | Lee .................................. 365/63 |
| 2004/0245547 | A1 | 12/2004 | Stipe | |
| 2006/0035474 | A1 | 2/2006 | Komilovich et al. | |
| 2007/0194301 | A1 | 8/2007 | Sezi et al. | |

FOREIGN PATENT DOCUMENTS

EP  1560268  8/2005

* cited by examiner

*Primary Examiner* — Tan T. Nguyen

(57) ABSTRACT

A multi-plane circuit structure has at least a first circuit plane and a second circuit plane, and each circuit plane has a plurality of row wire segments, a plurality of column wire segments, and a plurality of crosspoint devices formed at intersections of the row wire segments and the column wire segments. The row and column wire segments have a segment length for forming a preselected number of crosspoint devices thereon. Each row wire segment in the second circuit plane is connected to a row wire segment in the first circuit plane with no offset in a row direction and in a column direction, and each column wire segment in the second circuit plane is connected to a column wire segment in the first circuit plane with an offset length in both the row direction and the column direction. The offset length corresponds to half of the preselected number of crosspoint devices.

15 Claims, 5 Drawing Sheets

CONNECTION AND ADDRESSING OF MULTI-PLANE CROSSPOINT DEVICES

BACKGROUND

Over the last few decades, developments in semiconductor fabrication techniques have enabled the fabrication of increasingly smaller electronic components. The increased packing densities of electronic elements achievable in a circuit plane result in improved performances of integrated circuits. To meet the ever-increasing demands for higher device performances, however, it maybe necessary to add another dimension to the circuit structures.

For instance, nanoscale switching elements with resistive switching behavior have recently being discovered and are now the focus of intense research and development efforts. The nanoscale resistive switching devices can be used as non-volatile memory cells and can be fabricated in a two-dimensional crossbar structure with a very high cell density to provide a large memory capacity. Even higher memory capacities can be potentially obtained, however, by adding another dimension, i.e., by forming the nanoscale switching devices in multiple planes vertically stacked together. The ultra-high packing density of such a 3D memory structure is expected to be a viable solution for the demands for high information storage and throughput capabilities of future generations of computer applications.

Going from a two-dimensional circuit plane to a three-dimensional structure, however, is not a trivial task. One significant challenge is to find a way to connect the memory cells in the multiple planes such that each memory cell in the 3D structure can be uniquely addressed. A connection scheme that yields a limited addressing space will restrict the number of planes that can be included in the 3D structure. Also, the connection and addressing scheme should not be so complicated to render it infeasible to fabricate the 3D structure or result in poor performances of the memory devices.

BRIEF DESCRIPTION OF THE DRAWINGS

Some embodiments of the invention are described, by way of example, with respect to the following figures.

DETAILED DESCRIPTION

Figure 1:
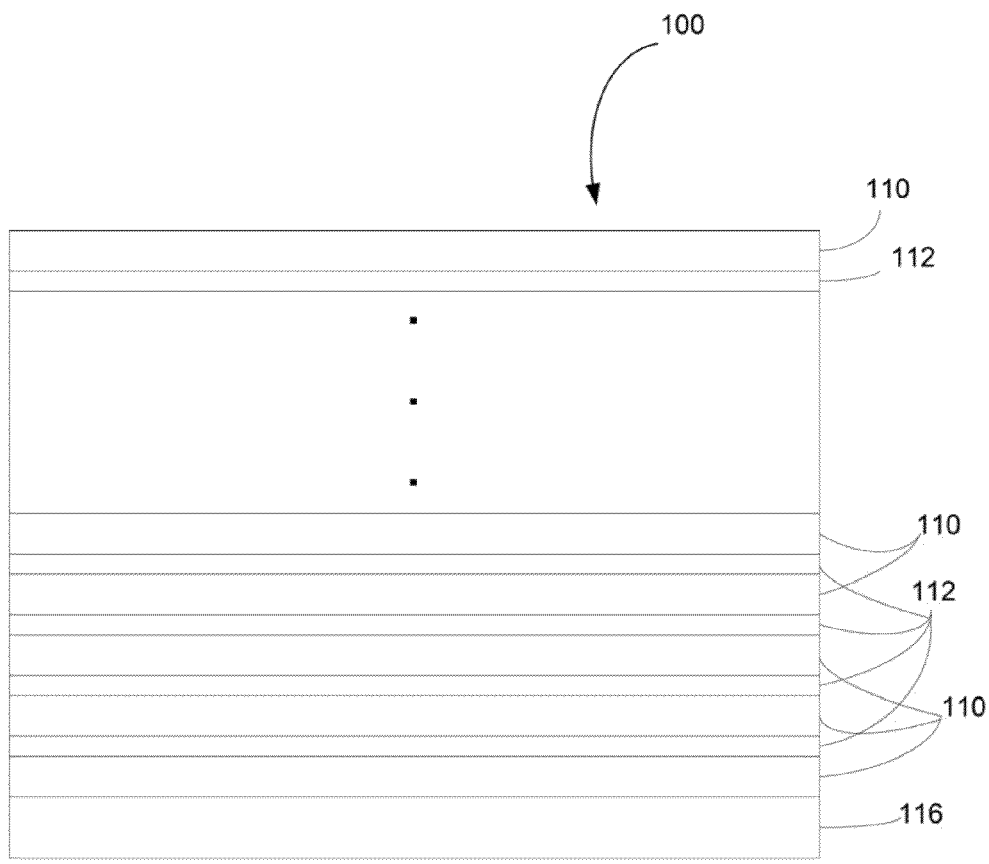
FIG. 1 is a schematic cross-sectional view, of a multi-plane circuit structure with addressable crosspoint devices in accordance with an embodiment of the invention.

FIG. 1 shows a multi-plane circuit structure 100 in accordance with an embodiment of the invention. The circuit structure 100 is a three-dimensional structure in that it comprises a plurality of generally two-dimensional circuit planes 110 stacked together in the vertical direction. As described in greater detail below, each two-dimensional memory plane 110 has a plurality of row and column wire segments formed therein, and a plurality of crosspoint devices formed at the intersections of the row and column wire segments. The circuit structure 100 also includes translation planes 112, each disposed between two adjacent memory planes 110. As also will be described in greater detail below, the translation planes 112 connect the wire segments in the memory planes 110 in a way that enables the crosspoint devices in all the planes to be uniquely addressable. The circuit structure 100 further includes a connection base plane 116 that allows external electrical connections to the circuit structure 100 to be formed for addressing and accessing the crosspoint devices.

Figure 2:
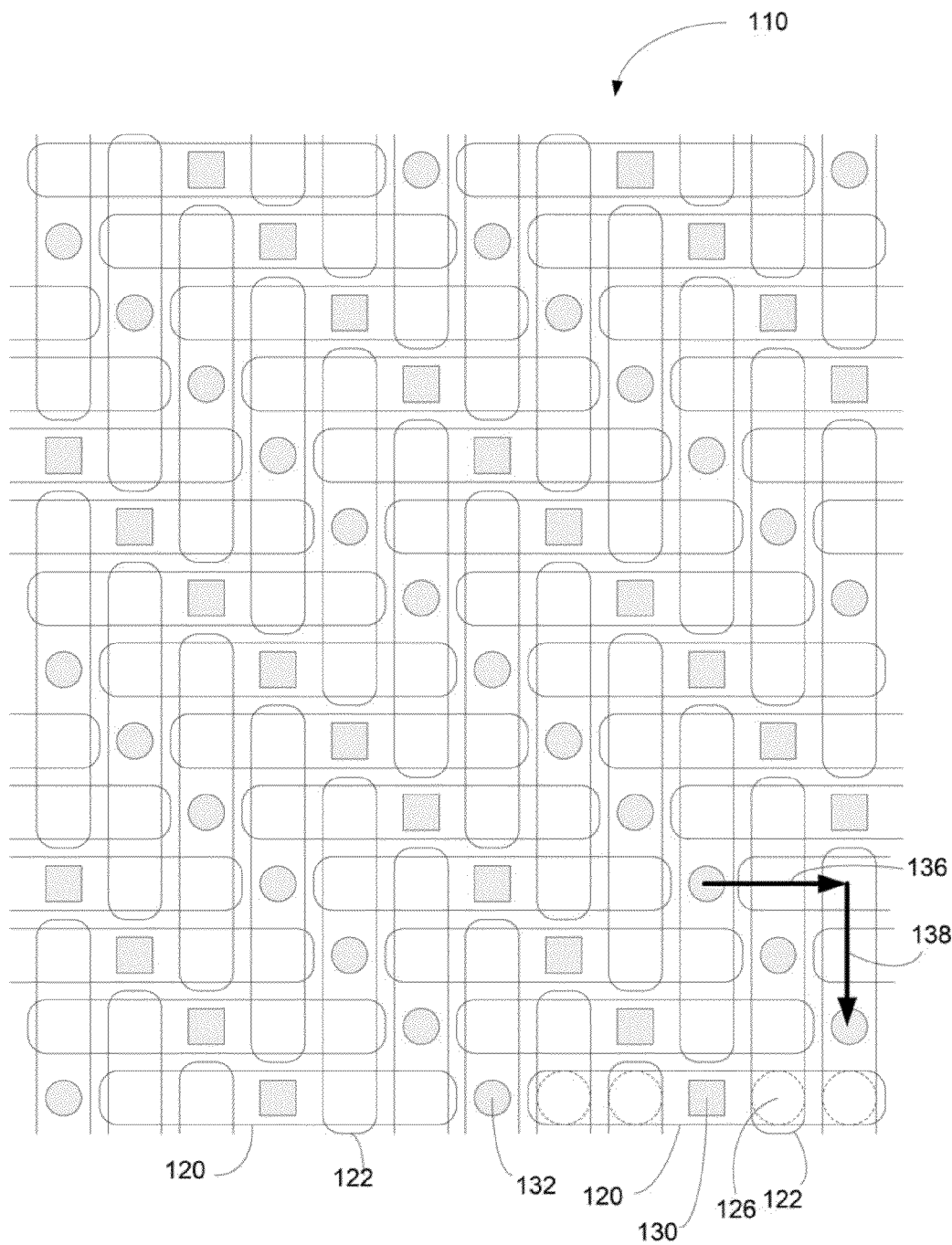
FIG. 2 is a schematic top view of a circuit plane with addressable crosspoint devices in an embodiment of the multi-plane circuit structure of FIG. 1.

FIG. 2 shows the components in a circuit plane 110 in one embodiment of the circuit structure 100. As shown in FIG. 2, the circuit plane 110 has a plurality of row wire segments 120 and column wire segments 122 formed there in. The row wire segments 120 are generally parallel to each other and extend in a first direction, and the column wire segments 122 are generally parallel to each other and extend in a second direction at an angle, such as 90 degrees, to the first direction. Each row wire segment 120 may intersect multiple column wire segments 122, and vice versa, and a crosspoint device 126 may be formed at each intersection of a row wire segment and a column wire segment between the two segments. For clarity of illustration, only several crosspoint devices are shown in FIG. 2. As used herein, the term "crosspoint device" means an electronic device formed at the intersection of two wire segments. For ease of description, the direction in which the row wire segments 120 extend is hereinafter referred to as the X direction, and the direction in which the column wire segments 122 extend is referred to as the Y direction. The direction normal to the circuit plane 110 is referred to as the Z direction.

The row and column wire segments have a segment length that is selected based on the number of crosspoint devices to be formed on each wire segment. In the embodiment of FIG. 2, for simplicity and clarity of illustration, the length of each row or column wire segment is selected such that four crosspoint devices may be formed on each wire segment. Nevertheless, a greater length of the wire segments can be selected to accommodate a greater number, such as 8, 16, 32, 64, 128, 256, etc., of crosspoint devices on each wire segment, and the connection and addressing scheme described below can be applied to those different segment lengths.

As shown in FIG. 2, the center of each column wire segment 122 is connected to a column via 132, and the center of each row wire segment 120 is connected to a row via 130. The column vias 122 and row vias 120 extend in the Z direction, i.e., normal to the plane, and only the ends of the row and column vias are schematically shown in the top view of the circuit plane. As shown in FIG. 2, each row segment 120 is offset from an adjacent row segment in the X direction by one unit length, which is the distance between the centers of two adjacent crosspoint devices. Thus, the center points (or the row vias) of the row wire segments 120 are placed on a diagonal line in the plane. Similarly, each column wire segment 122 is offset from an adjacent column wire segment by one unit length in the Y direction, so the center points (or column vias) of the column wire segments 122 are also placed on a diagonal line in the plane. The separation in either the X or Y direction between a diagonal line of row vias 130 and an adjacent diagonal line of column vias 132 is n/2 +1 unit lengths, where n is the number of crosspoint devices to be formed on each wire segment. As will be described in greater detail below, each row wire segment 120 is connected by a row via 130 to a row wire segment in a lower circuit plane at the same XY location, and each column wire segment 122 is connected by a column via 132 and an offset connector segment in a translation plane to a column wire segment in the lower circuit plane that is shifted by n/2 unit lengths in both the X and Y directions. In the illustrated embodiment of FIG. 2, N is selected to be 4, so the offset is 2 unit lengths. This offset is shown as two arrows 136 and 138 in FIG. 2.

Figure 3:
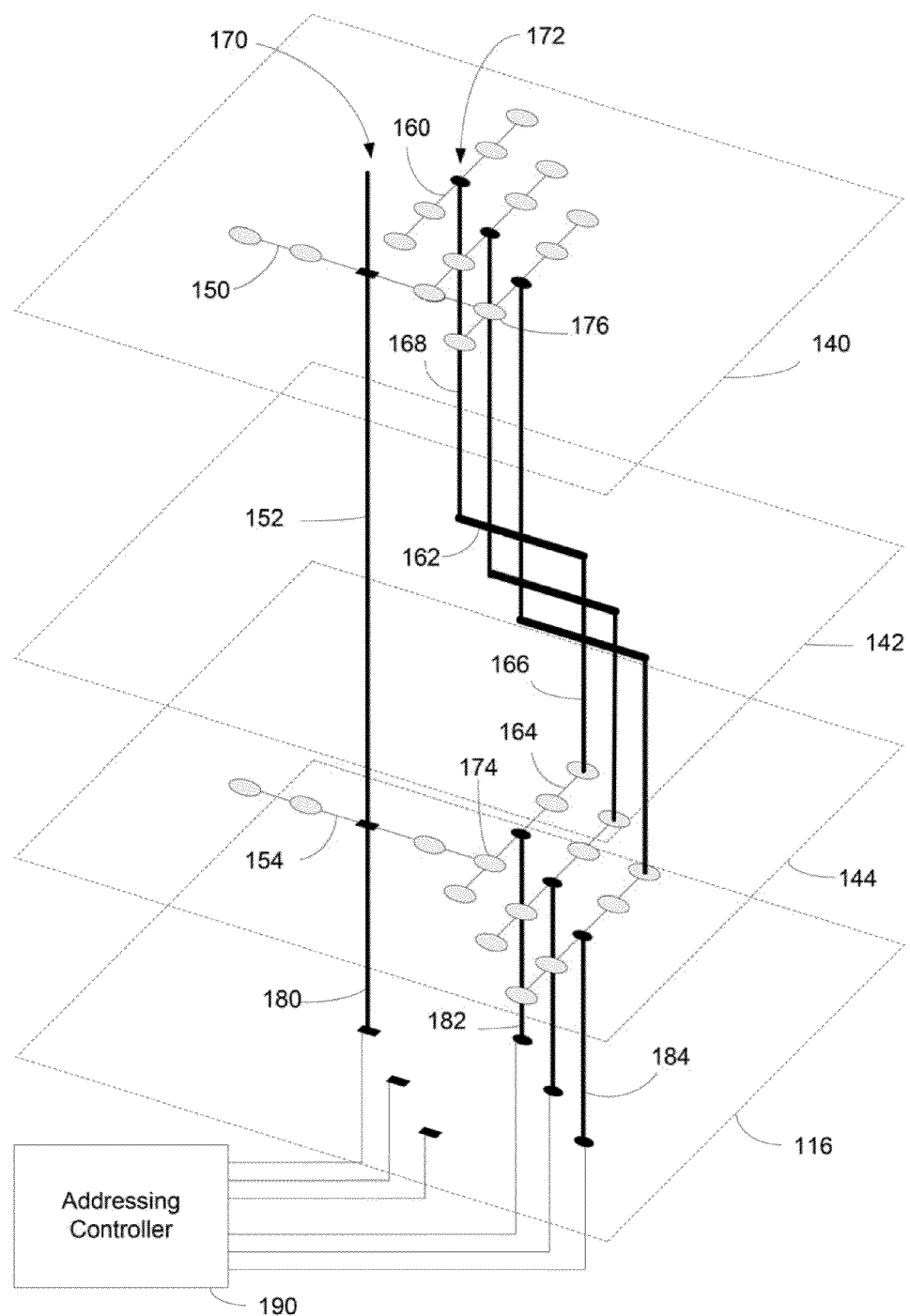
FIG. 3 is a schematic exploded view of several row and column crossbar wire segments in two adjacent circuit planes and a translation layer disposed between the two circuit planes.

This offset between two connected column wire segments in two adjacent circuit planes allows each of the crosspoint devices formed on the different circuit planes to be uniquely addressable. To illustrate this point, FIG. 3 shows selected wire segments on two adjacent circuit planes 140 and 144. As shown in FIG. 3, a row wire segment 150 in the circuit plane 140 is connected by a row via 152 to a row wire segment 154 in the circuit plane 144 below. The two row wire segments 150 and 154 have the same XY location on their respective circuit planes. In other words, there is no offset in their XY coordinates. In contrast, a column wire segment 160 on the circuit plane 140 is electrically connected to a column wire segment 164 on the circuit plane 144 with an offset of n/2 unit lengths in both X and Y directions. In the illustrated embodiment of FIG. 3, n=4, so the offset is 2 unit lengths in each direction. This offset connection is provides by an offset connector segment 162 in the translation layer 142 between the circuit planes 140 and 144. The offset connector segment 162 is connected to one end of the column wire segment 164 in the lower circuit plane 144 by a via 166, and connected to the center point of the column wire segment 160 in the upper circuit plane 140 by the column via 168. In this way, the centers of the two connected column wire segments 160, 164 are offset by n/2 unit lengths in both the X and Y directions.

For simplicity and clarity of illustration, the circuit planes 140 and 144 are shown as if they were single thin planes containing row wire segments, column wire segments, and crosspoint devices. In actually physical implementations of some embodiments, each of the referenced circuit planes may comprise 5 sub-planes. In a bottom-to-top order, sub-plane one contains bottom vias connected to sub-plane two, which contains row wire segments and through-via pads. A through-via pad is typically a small patch of metal with its bottom side connected to a lower via and its top side connected to an upper via. The function of a through-via pad is to provide an electrical path through a plane (or sub-plane) without making a circuit connection in that plane. Sub-plane three of the circuit plane contains vias connecting the conductors in sub-plane two to corresponding conductors in sub-plane five, which contains the column wire segments and through-via pads. Sub-plane four defines the crosspoint devices with electrical connections to the row wire segments in sub-plane two and column wire segments in sub-plane five. The translation layer 142 may also have multiple sub-planes. In some embodiments, the translation layer 142 is formed of two sub-planes. Sub-plane one contains vias to a lower conductor plane, such as sub-plane five of the circuit plane 144, and sub-plane two contains offset connector segments and through-via pads.

The effect of the n/2 inter-plane offset can be seen by looking at the crosspoint devices formed at the intersections of the column and row wire segments on the two circuit planes 140 and 144. As shown in FIG. 3, the column wire segment 164 intersects the row wire segment 154 on the lower circuit plane 144 and forms a crosspoint device 174. In contrast, the column wire segment 160 in the upper circuit plane 140 does not intersect the row column segment 150. This is because the offset of n/2 unit lengths in X and Y directions between the column wire segment 160 and the column wire segment 164 prevents the column wire segment 160 from intersecting the row wire segment 150. In effect, this offset prevents two connected column wire segments from intersecting two connected row wire segments on two different circuit planes. If another circuit plane is added on top of the circuit plane 140, the offset per plane will cause the connected column wire segment in that plane to be further apart from the connected row wire segment in that plane.

A useful way to understand this connection scheme is to think of the row and column wire segments as belonging to connected chains of wire segments that extend across the different circuit planes. For instance, the column wire segment 160, the via 168, the offset connector segment 162, the via 166, and the column wire segment 164 form a portion of a chain 172 of connected column wire segments, while the row wire segment 150, the via 152, and the row wire segment 154 form a portion of a chain 170 of connected row wire segments. Even though each chain extends through multiple planes, they are arranged such that each chain of connected column wire segments in the multi-plane circuit structure can have at most one intersection with a chain of connected row wire segments, regardless of the total number of planes in the circuit structure. This guarantees that each crosspoint device in the multi-plane circuit structure can be uniquely addressed by identifying the chain of connected column wire segments and the chain of connected row wire segments that intersect to form the crosspoint device. The condition that each chain of row wire segments can intersect a chain of column wire segment at most once is achieved by adding an offset of n/2 unit lengths per plane in both X and Y direction's to the chain of column wire segments, as explained above.

Assuming that there are M rows and N columns in each plane (i.e., an M by N grid), the number of column wire segments in each plane is about N*M/L, where L is the length of the wire segments. The number of row wire segments per plane is M*N/L. Since each column wire segment belongs to a chain of connected column wire segments, the total number of chains of connected column wire segments in the 3D stack is N*M/L, the number of column segments per plane. Similarly, the total number of chains of connected row wire segments in the 3D stack is M*N/L. In this regard, to allow addressing of each crosspoint device, each of chains of connected row wire segments and column wire segments has a via in the base connection plane to allow connection to an external addressing circuit, so the total number of connection vias in the base connection plane is about 2 M*N/L. On this point, it should be appreciated that the wire segments, vias, and offset connectors in a 3D stack constructed according to embodiment of the invention can be formed using known semiconductor fabrication techniques.

The connection scheme described above allows many circuit planes to be stacked together while maintaining the ability to uniquely address each of the crosspoint devices in the stack. Due to the offset per plane corresponding to half the wire segment length L in both the X and Y directions for connected column wire segments in a chain, the number of circuit planes that can be connected in this manner is proportional to the smaller of M/L and N/L. Thus, many addressable circuit planes can be had in the 3D stack by selecting the proper M, N, and L values. Performance considerations of circuit operations (read and write) may place a limit on M and N, while L may be limited by circuit layout considerations. On the other hand, in actual applications, circuit operations and fabrication economics often limit the number of circuit planes to be stacked together. In that case, if the desired number of planes and the number of rows and columns are determined, then the wire segment length may be selected accordingly.

As a related aspect, the total length of a chain of connected column or column wire segment may be measured as the number of cross-point devices on each chain. In the connection scheme described above, the length of each chain through the 3D stack is comparable to the maximum row or column lengths (i.e., M or N) in a conventional M-by-N array in a single plane. Thus, the connection scheme of embodiments of the invention is expected to yield comparable performances of the crosspoint devices in the multi-plane structure compared to those in a single plane structure.

Figure 4:
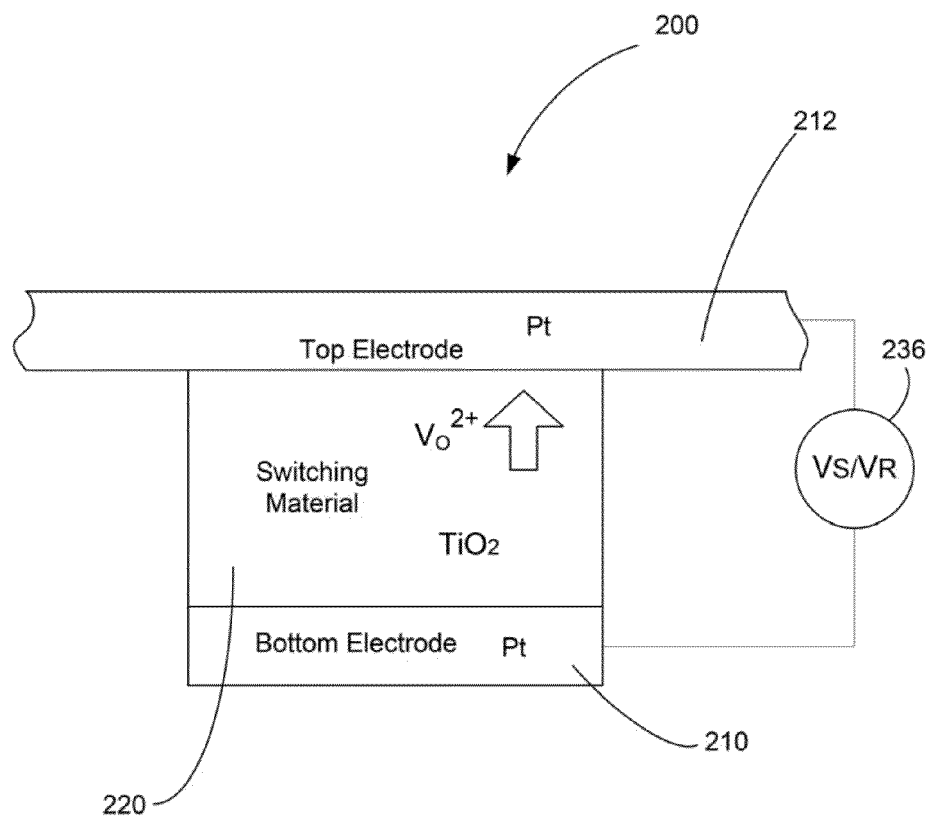
FIG. 4 is a schematic cross-section view of a resistive switching device that may be a crosspoint device in an embodiment of the invention.

In some embodiments, the crosspoint devices formed at the intersections of the row and column wire segments may be memory cells. Each of such memory cells may be switchable between an OFF or "0" state and an ON or "1" state, and may even have programmable intermediate states. More specifically, in some of those embodiments, the memory cell may be a resistive switching device. FIG. 4 shows an example of a resistive switching device 200 in the form of a crosspoint device. The resistive switching device comprises a bottom electrode 210 and a top electrode 212 extending over the bottom electrode. Disposed between the top and bottom electrode 212 and 210 is an active region 220 that exhibits the resistive switching behavior. The top electrode 212 may be, for example, a part of a column wire segment 122 in FIG. 2, and the bottom electrode 210 may be a portion of a row wire segment 120. The electrodes 210 and 212 are formed of a conductive material, which may be a metal such as platinum, gold, copper, tantalum, tungsten, etc., or doped semiconductor materials.

The active region 220 disposed between the top electrode 212 and bottom electrode 210 contains a switching material. The switching material is capable of carrying a species of mobile ionic dopants such that the dopants can be controllably transported through the switching material and redistributed over the active region 220. The redistribution of the dopants changes the electrical properties of either the switching material or the interface of the switching material and an electrode, which in the illustrated example of FIG. 2 may be the top electrode 212. This ability to change the electrical properties as a function of dopant distribution allows the switching device 200 to be placed in different resistance states by applying a voltage from a voltage source 236 to the electrodes 210 and 212. Switching devices of this type have been identified as a form of "memristors."

Generally, the switching material may be electronically semiconducting or nominally insulating and a weak ionic conductor. Many different materials with their respective suitable dopants can be used as the switching material. Materials that exhibit suitable properties for resistive switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of a transition metal oxide such as $TiO_2$, the dopant species may be oxygen vacancies ($V_O^{2+}$). For GaN, the dopant species may be nitride vacancies or sulfide ion dopants. For compound semiconductors, the dopants may be n-type or p-type impurities.

By way of example, as illustrated in FIG. 4, the switching material may be $TiO_2$, and the dopants may be oxygen vacancies ($V_O^{2+}$). Initially, there may be an asymmetry in the dopant distribution. For example, the dopant concentration may have a gradient across the active region 220, being higher around the bottom electrode 210 and substantially lower around the top electrode 212. In this regard, in some embodiments, a region (e.g., adjacent the bottom electrode 210) may be formed to have a high concentration of dopants to serve as a reservoir of dopants that can be redistributed over the active region during a switching operation. When a DC switching voltage from the voltage source 236 is applied to the top and bottom electrodes 212 and 210, an electrical field is created across the active region 220. This electric field, if of sufficient strength and proper polarity, may drive the oxygen vacancies to drift through the switching material in the active region 220 towards the top electrode 212, thereby turning the device into an ON state that has a low resistance.

If the polarity of the electrical field is reversed, the oxygen vacancies may drift in an opposite direction across the active region 220 and away from the top electrode 212, thereby turning the device into an OFF state with a high resistance. In this way, the switching is reversible and may be repeated. Moreover, the switching device 200 may be put in an intermediate state with a resistance value between the ON an OFF resistance values. Due to the relatively large electrical field needed to cause dopant drifting, after the switching voltage is removed, the locations of the dopants remain stable in the switching material. In other words, the switching may be non-volatile. The state of the switching device 200 may be read by applying a read voltage from the voltage source 236 to the top and bottom electrodes 212 and 210 to sense the resistance across these two electrodes. The read voltage is typically much lower than the switching voltage required to cause drifting of the ionic dopants in the active region 220, so that the read operation does not alter the ON/OFF (or intermediate) state of the switching device.

Returning now to FIG. 3, the multi-plane circuit structure includes a base connection plane 116. For illustration purposes, the lower circuit plane 144 is shown to be the first circuit plane above the base connection plane 116, and the upper circuit plane 140 is the second circuit plane in the sequence. Each of the row and column wire segments in the first plane 144 is connected by a via to the base connection plane 116. In other words, each chain of connected row or column wire segments in the multi-plane circuit structure has a connection via is the base connection plane 116. For instance, the chain 170 has a connection via 180, and the chain 172 has a connection via 182, in the base connection plane 116. The connection vias allow the chains of connected wire segments in the multi-plane structure to be connected to an external addressing controller 190, which is capable of selecting a desired chain of column wire segments and a desired chain of connected row wire segments to access a desired crosspoint device. For example, the crosspoint device 174 formed at the intersection of the column wire segment 164 and row wire segment 154 can be addressed by selecting the column connection via 182 and the row connection via 180 in the base connection plane 116. As another example, the crosspoint device 176 on the circuit plane 140 can be addressed by selecting the row connection via 180 and the column connection via 184.

Figure 5:
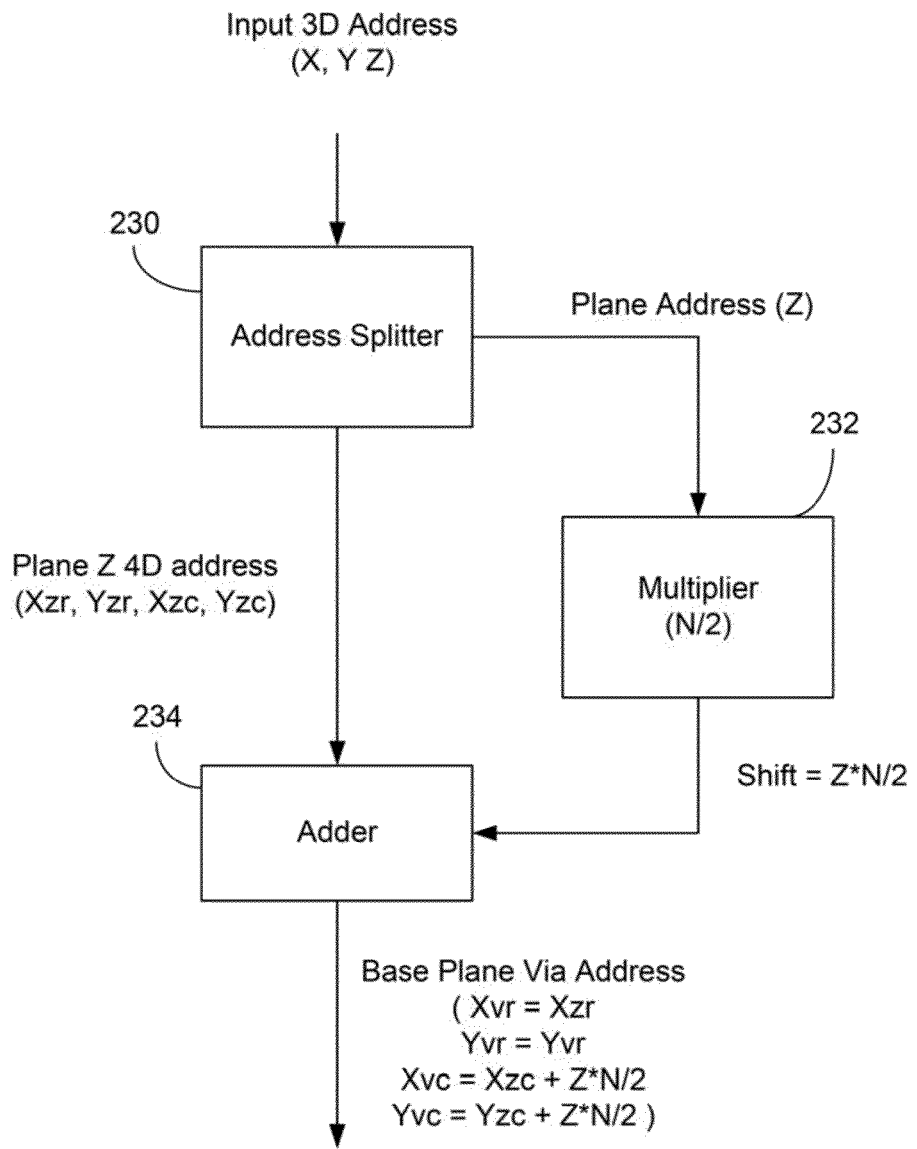
FIG. 5 is a diagram showing an operation of translating a 3D address into an address in a 4D address scheme for addressing a crosspoint device in a multi-plane circuit structure constructed in accordance with an embodiment of the invention.

The concept of addressing a crosspoint device in the multi-plane circuit structure by means of its associated connection vias is further illustrated in the address translation operation shown in FIG. 5. Generally, a given crosspoint device in the multi-plane circuit structure can be identified by the plane it is in and its X and Y positions in that plane. In other words, the crosspoint device can be identified by a three-dimensional address (X, Y, Z), where Z identifies the plane. To actually access the crosspoint device, however, this 3D address has to be translated into the locations of the two vias in the connection plane 116 that are electrically connected to the crosspoint device. The two connection vias in the base connection plane 116 can be identified by (Xvr, Yvr, Xvc, Yvc), where Xvr and Yvr represent the location of the connection via of the chain of connected row wire segments, and Xvc and Yvc represent the location of the connection via of the chain of connected column wire segments. Thus, the address translation is from a 3D address of (X, Y, Z) to a 4D address of (Xvr, Yvr, Xvc, Yvc).

In the illustrated embodiment of FIG. 3, the address translation is performed by the addressing controller 190. The regular offset of two connected column wire segments in adjacent planes makes this translation very easy. As shown in FIG. 5, first, the input 3D address goes through a splitter 230 that separates the Z coordinate from the X and Y coordinates. The X and Y coordinates of the crosspoint device are then converted to the coordinates of the row wire segment and column wire segment that intersect to form the crosspoint device. In this regard, the row and column wire segments can be identified by the locations of their respective center points in that circuit plane, represented by (Xzr, Yzr, Xzc, Yzc), where the subscript z indicates that the XY coordinates are for plane Z.

As mentioned above, each row or column wire segment on a circuit plane is part of a connected chain of wire segments that has a connection via in the base connection plane. In the illustrated embodiment of FIG. 3, all the row wire segments in a connected chain have the some XY location in their respective planes, i.e., there is no XY offset. Thus, the row connection via in the base connection plane 116 is at the same XY location as the row wire segment in plane Z, i.e., Xvr=Xzr, and Yvr=Yzr. In contrast, there is a shift of n/2 unit lengths in both X and Y directions every time the chain of connected column wire segments moves down one plane. Assuming that the base connection plane 116 is the $0^{th}$ plane, the location of the column connection via in the base connection plane can be determined as Xvc=Xzc+Z*N/2, and Yvc=Yzc+Z*N/2. In this way, the 3D address of a crosspoint device can be easily translated into the 4D address of the associated connection vias. In FIG. 5, the total shift between plane Z and the base connection plane, which is Z*N/2, is generated by a multiplier 232. The offset is then added by an adder 234 to the coordinates of the column wire segment on plane Z to produce the column via coordinates in the base connection plane. Once the 4D address of the connection vias in the base connection plane 116 is obtained, those vias can be selected by the addressing controller 190 to access the desired crosspoint device.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A multi-plane circuit structure comprising:
at least a first circuit plane and a second circuit plane, each of the first and second circuit planes having a plurality of row wire segments, a plurality of column wire segments, and a plurality of crosspoint devices formed at intersections of the row wire segments and the column wire segments, each of the row and column wire segments having a segment length for forming a preselected number of crosspoint devices thereon,
wherein each row wire segment in the second circuit plane is connected to a row wire segment in the first circuit plane with no offset in a row direction and in a column direction, and each column wire segment in the second circuit plane is connected to a column wire segment in the first circuit plane with an offset length in both the row direction and the column direction, the offset length corresponding to half of the preselected number of crosspoint devices.

2. A multi-plane circuit structure as in claim 1, wherein each row wire segment is offset from an adjacent row wire segment in its circuit plane by one unit length in the row direction, and each column wire segment is offset from an adjacent column wire segment in its circuit plane by one unit length in the column direction, wherein a unit length corresponds to a separation between two adjacent crosspoint devices.

3. A multi-plane circuit structure as in claim 2, further including a translation layer disposed between the first and second circuit planes, wherein the translation layer includes a plurality of offset connector segments, each offset connector segment for connecting a column wire segment in the first circuit plane to a corresponding column wire segment in the second circuit plane.

4. A multi-plane circuit structure as in claim 3, wherein each row wire segment on the second circuit plane is connected at its center point by a via to the center point of a corresponding row wire segment on the first circuit plane.

5. A multi-plane circuit structure as in claim 4, wherein each offset connector segment in the translation layer connects an end of a column wire segment in the first circuit plane to the center point of a corresponding column wire segment in the second circuit plane.

6. A multi-plane circuit structure as in claim 5, further including a base connection plane, the base connection plane having a plurality of row connection vias each connected to a row wire segment in the first circuit plane, and a plurality of column connection vias each connected to a column wire segment in the first circuit plane.

7. A multi-plane circuit structure as in claim 1, wherein each crosspoint device is a memory cell.

8. A multi-plane circuit structure as in claim 7, wherein each memory cell is a resistive switching device having a first electrode formed of a portion of a row wire segment, a second electrode formed of a portion of a column wire segment, and an active region disposed between the first and second electrodes, the action region containing a switching material capable of carrying a species of dopants and transporting the dopants under an electrical field to change a resistance of the resistive switching device.

9. A multi-plane circuit structure as in claim 8, wherein the switching material is an oxide.

10. A multi-plane circuit structure comprising:
a plurality of circuit planes and one or more translation layers, each translation layer being disposed between two adjacent circuit planes;
a plurality of chains of connected row wire segments, each chain of connected row wire segments having one row wire segment on each of the circuit planes;
a plurality of chains of connected column wire segments, each chain of connected column wire segments having one column wire segment on each of the circuit planes, every two consecutive column wire segments in the chain being connected to an offset connector segment in a translation layer to provide an offset in both a column direction and a row direction between the two consecutive column wire segments;
wherein the chains of connected row wire segments and the chains of connected column wire segments are disposed such that each chain of connected row wire segments forms at most one intersection with each chain of connected column wire segments; and
a plurality of crosspoint devices each formed at one of the intersections of the chains of connected row wire segments and chains of connected column wire segments.

11. A multi-plane circuit structure as in claim 10, further including a base connection plane, the base connection plane having a plurality of row connection vias each connected to a chain of connected row wire segments, and a plurality of column connection vias each connected to a chain of connected column wire segments.

12. A multi-plane circuit structure as in claim 11, wherein the row wire segments and the column wire segments have a segment length for forming a preselected number of crosspoint devices, and the offset has a length corresponding to half of the preselected number of crosspoint devices.

13. A multi-plane circuit structure as in claim 12, wherein each offset connector segment connects an end of a column wire segment in a chain of connected column wire segments to a center point of a consecutive column wire segment in the chain.

14. A multi-plane circuit structure as in claim 10, wherein the crosspoint devices are memory cells.

15. A multi-plane circuit structure as in claim 14, wherein each memory cell is a resistive switching device having a first electrode formed of a portion of a row wire segment, a second electrode formed of a portion of a column wire segment, and an active region disposed between the first and second electrodes, the action region containing a switching material capable of carrying a species of dopants and transporting the dopants under an electrical field to change a resistance of the resistive switching device.

* * * * *